United States Patent
Robison et al.

(10) Patent No.: US 9,859,421 B1
(45) Date of Patent: Jan. 2, 2018

(54) VERTICAL FIELD EFFECT TRANSISTOR WITH SUBWAY ETCH REPLACEMENT METAL GATE

(71) Applicant: INTERNATIONAL BUSINESS MACHINES CORPORATION, Armonk, NY (US)

(72) Inventors: Robert R. Robison, Colchester, VT (US); Reinaldo A. Vega, Mahopac, NY (US); Rajasekhar Venigalla, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/271,842

(22) Filed: Sep. 21, 2016

(51) Int. Cl.
*H01L 29/78* (2006.01)
*H01L 29/66* (2006.01)
*H01L 29/49* (2006.01)

(52) U.S. Cl.
CPC ...... *H01L 29/7827* (2013.01); *H01L 29/4966* (2013.01); *H01L 29/66545* (2013.01); *H01L 29/66666* (2013.01)

(58) Field of Classification Search
CPC ......... H01L 21/823885; H01L 29/7827; H01L 29/78642; H01L 29/66666
See application file for complete search history.

(56) References Cited

U.S. PATENT DOCUMENTS

| | | | | |
|---|---|---|---|---|
| 5,017,977 A * | 5/1991 | Richardson | ........... | H01L 27/115 257/316 |
| 5,416,350 A * | 5/1995 | Watanabe | ........... | H01L 29/7827 257/302 |
| 5,627,390 A * | 5/1997 | Maeda | .................... | H01L 21/84 257/302 |
| 5,707,885 A * | 1/1998 | Lim | .................. | H01L 29/78642 257/E21.703 |
| 6,033,957 A * | 3/2000 | Burns, Jr. | ......... | H01L 27/10841 257/E21.652 |

(Continued)

OTHER PUBLICATIONS

Hergenrother et al., "The Vertical Replacement-Gate (VRG) MOSFET: A 50-nm Vertical MOSFET with Lithography-Independent Gate Length", International Electron Devices Meeting, Dec. 5-8, 1999. Published in Technical Digest. International, 1999 IEEE. pp. 361-364.

(Continued)

*Primary Examiner* — Jarrett Stark
(74) *Attorney, Agent, or Firm* — Tutunjian & Bitetto, P.C.; Louis J. Percello

(57) ABSTRACT

A method is presented for forming a vertical field effect transistor (VFET) structure. The method includes forming a plurality of vertical fins over a substrate, forming a dummy gate between the plurality of vertical fins, removing the dummy gate with a subway etch to define a gate cavity, and forming a high-k metal gate (HKMG) stack within the gate cavity. The method further includes forming the first and second source/drain regions before the HKMG stack. The method further includes defining the HKMG stack by a replacement metal gate (RMG) process, the RMG process defined in part by the subway etch. The subway etch enables removal of the dummy gate from a side portion of the VFET structure.

10 Claims, 16 Drawing Sheets

(56) References Cited

U.S. PATENT DOCUMENTS

| | | | |
|---|---|---|---|
| 6,294,418 B1* | 9/2001 | Noble | H01L 21/823885 257/E21.429 |
| 6,406,962 B1* | 6/2002 | Agnello | H01L 21/84 257/E21.703 |
| 6,461,900 B1* | 10/2002 | Sundaresan | H01L 21/823885 257/E21.643 |
| 6,483,171 B1* | 11/2002 | Forbes | H01L 21/823807 257/351 |
| 6,518,622 B1 | 2/2003 | Chew et al. | |
| 6,686,604 B2 | 2/2004 | Layman et al. | |
| 6,773,994 B2 | 8/2004 | Chittipeddi et al. | |
| 7,033,877 B2 | 4/2006 | Chaudhry et al. | |
| 8,039,893 B2* | 10/2011 | Masuoka | H01L 27/092 257/329 |
| 8,497,548 B2* | 7/2013 | Masuoka | H01L 21/823885 257/329 |
| 8,936,976 B2 | 1/2015 | Radosavljevic et al. | |
| 9,184,238 B2 | 11/2015 | Hisada et al. | |
| 9,299,835 B1 | 3/2016 | Anderson et al. | |
| 2001/0052614 A1* | 12/2001 | Ishibashi | H01L 27/10876 257/306 |
| 2002/0034853 A1* | 3/2002 | Alavi | H01L 29/66666 438/283 |
| 2004/0063286 A1* | 4/2004 | Kim | H01L 21/823412 438/283 |
| 2007/0052012 A1* | 3/2007 | Forbes | B82Y 10/00 257/328 |
| 2010/0213525 A1* | 8/2010 | Masuoka | H01L 21/823828 257/306 |
| 2011/0115011 A1* | 5/2011 | Masuoka | H01L 21/823431 257/314 |
| 2011/0215381 A1* | 9/2011 | Masuoka | H01L 27/14607 257/229 |
| 2014/0035059 A1 | 2/2014 | Giles et al | |

OTHER PUBLICATIONS

H.V. Mallela et al., "Vertical field effect transistors with metallic source/drain regions", U.S. Appl. No. 15/140,763, filed Apr. 28, 2016.

* cited by examiner

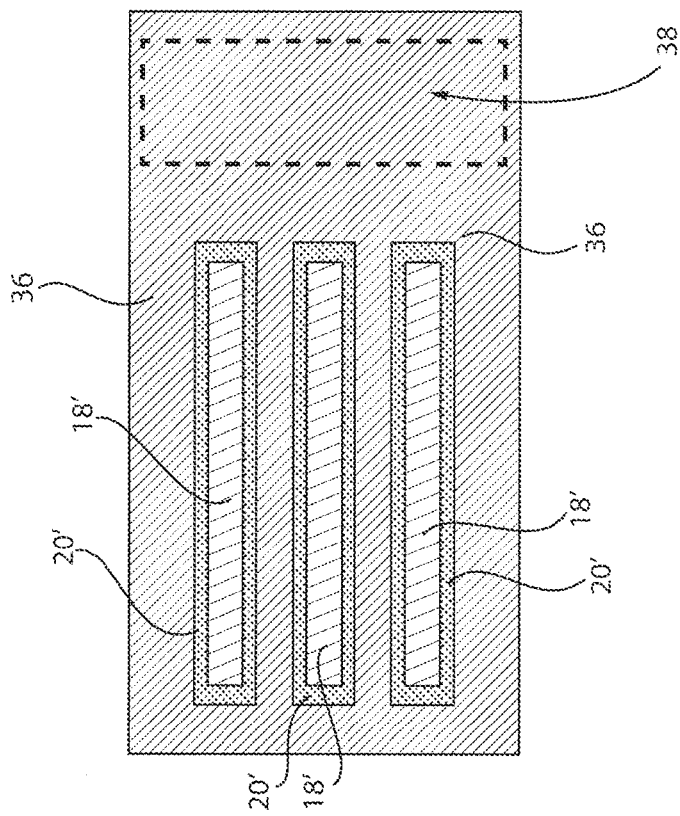
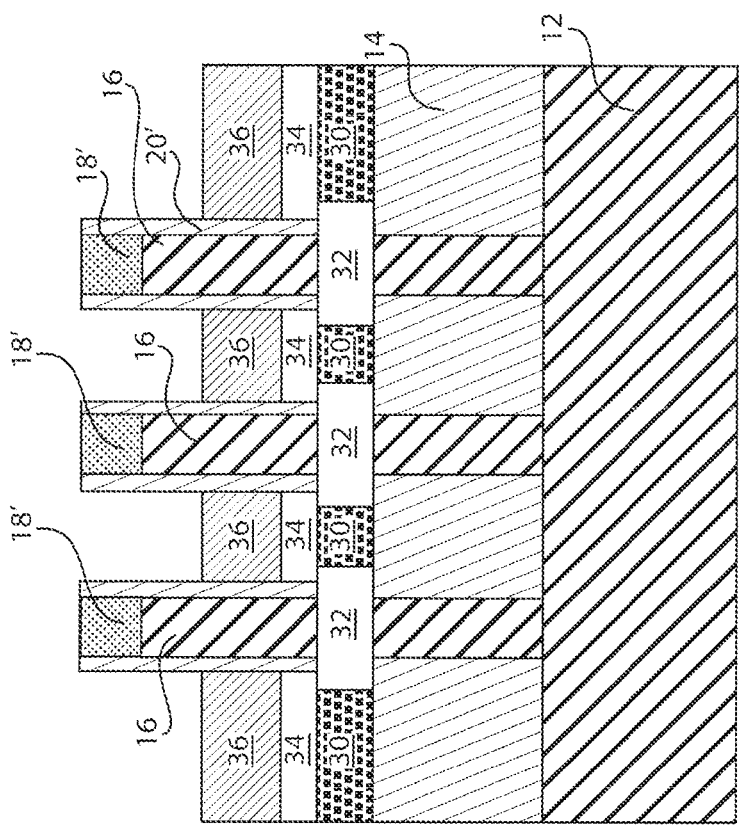
FIG. 10
FIG. 9

VERTICAL FIELD EFFECT TRANSISTOR WITH SUBWAY ETCH REPLACEMENT METAL GATE

BACKGROUND

Technical Field

The present invention relates generally to semiconductor devices, and more specifically, to vertical field effect transistors (VFETs) including a high-k metal gate (HKMG) stack defined by a replacement metal gate (RMG) process.

Description of the Related Art

A vertical field effect transistor (VFET) has a channel perpendicular to the substrate surface, as opposed to being situated along the plane of the surface of the substrate. By using this design, it is possible to increase packing density. That is, by having the channel perpendicular to the substrate surface, VFETs improve the scaling limit beyond conventional longitudinal finFETs.

SUMMARY

In accordance with an embodiment, a method is provided for forming a vertical field effect transistor (VFET) structure. The method includes forming a plurality of vertical fins over a substrate, forming a dummy gate between the plurality of vertical fins, removing the dummy gate with a subway etch to define a gate cavity, and forming a high-k metal gate (HKMG) stack within the gate cavity.

In accordance with another embodiment, a semiconductor device, such as a VFET is provided. The VFET structure includes a plurality of vertical fins formed over a substrate, a dummy gate formed between the plurality of vertical fins, the dummy gate removed with a subway etch to define a gate cavity, and a high-k metal gate (HKMG) stack formed within the gate cavity.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 9 is a cross-sectional view of the semiconductor device of FIG. 8 where a dummy gate stack is deposited, planarized, and back etched, in accordance with an embodiment of the present invention;

FIG. 10 is a top view of the semiconductor device of FIG. 9 illustrating the dummy gate stack, in accordance with an embodiment of the present invention;

Throughout the drawings, same or similar reference numerals represent the same or similar elements.

DETAILED DESCRIPTION

Figure 2:
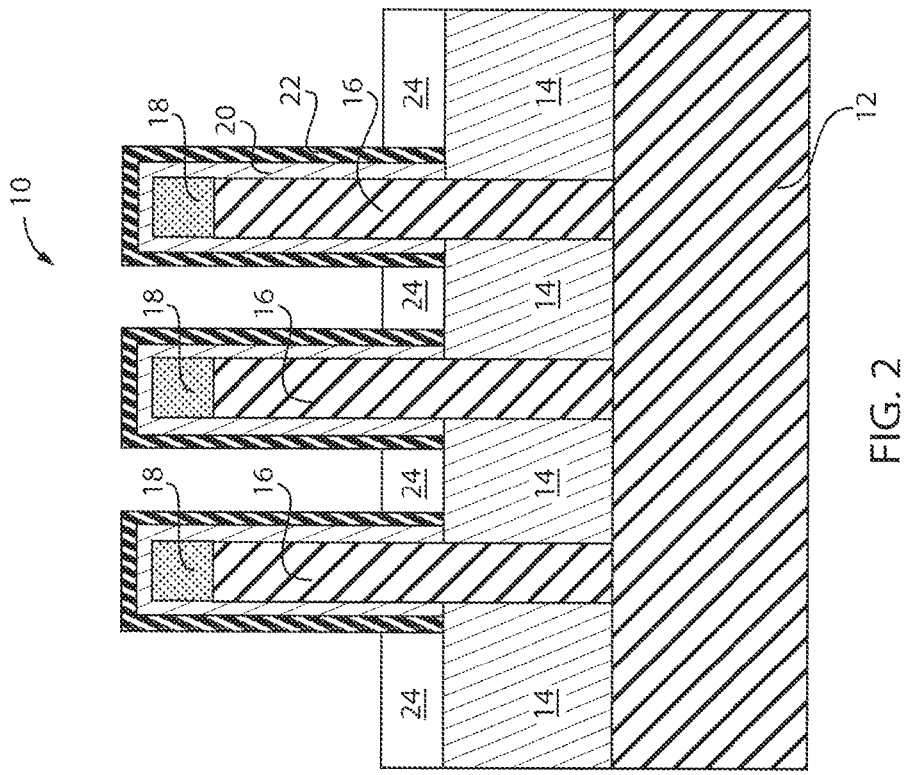
FIG. 2 is a cross-sectional view of the semiconductor structure of FIG. 1 where a sacrificial material is deposited, planarized, and back etched, in accordance with an embodiment of the present invention.

In one or more embodiments, each fin of the plurality of fins includes a first section having a first width, a second section having a second width, and a third section having a third width, the first and third sections connected to each other by the second section to form a dumbbell fin structure. The second width is self-aligned to the HKMG stack. In one embodiment, the HKMG stack engages an outer surface of the second section of a fin when disposed between first and second (or top and bottom) spacers. The first section of each fin of the plurality of fins engages a first source/drain region and the third section of each fin of the plurality of fins engages a second source/drain region. In one or more embodiments, the first and second source/drain regions are formed before the HKMG stack.

In one or more embodiments, a top source/drain is epitaxially formed before the HKMG stack is defined in the VFET structure. In another embodiment, the HKMG stack is defined by a replacement metal gate (RMG) process, which itself is enabled in part by a subway etch. Subway etch avoids the need to access the dummy gate from the top of the VFET device. The dummy gate is instead removed and replaced from the side of the VFET structure. In another embodiment, the dumbbell fin structure is self-aligned to the HKMG stack.

In one or more embodiments, enablement of a higher thermal budget for the top epitaxially grown source/drain regions is achieved, as well as higher epitaxial growth quality, higher in-situ doping, and lower resistance. In another embodiment, multi-Vt is enabled through a poly open process rather than a fin blocking process. In another embodiment, dumbbell fins come "for free," thus enabling co-optimization of SCE and external under-spacer resistance with single dummy oxide removal etch.

In one or more embodiments, a VFET process is defined which enables the top source/drain epitaxial region to be formed with a high thermal budget, to minimize defects stemming from epitaxial growth, and to minimize sheet resistance. In one or more embodiments, a VFET replacement metal gate (RMG) process is defined that is compatible with tight fin pitches to enable multi-Vt processing. In one or more embodiments, a VFET process is defined which achieves a dumbbell fin structure that is self-aligned to the HKMG stack, to permit co-optimization of short channel effects and external resistance.

In one or more embodiments, the HKMG stack is defined by a RMG process defined in part by a subway etch. The subway etch enables removal of the dummy gate from a side portion of the VFET structure, the dummy gate replaced with the HKMG stack. In one embodiment, at least one material of the HKMG stack has a dielectric constant greater than 7.

In one or more embodiments, the dummy gate structure is defined during the vertical FET process flow, which is later replaced with a HKMG structure/stack, after all source/drain formation is complete. Since VFETs are typically formed from the bottom up, starting with the bottom source/drain region, bottom spacer, HKMG, top spacer, and top source/drain region, the HKMG stack would conventionally be formed before the top source/drain region. However, this limits the thermal budget of the top source/drain epitaxy to whatever the HKMG stack can withstand. In contrast, in one or more embodiments, a method and structure is described where the top source/drain epitaxy is grown in the presence of a dummy gate structure that does not have the thermal budget limitations that an existing HKMG stack would have. This dummy gate structure is later removed by a subway etch process and replaced with a HKMG stack.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure may be present between the first element and the second element.

The term "electrically connected" means either directly electrically connected, or indirectly electrically connected, such that intervening elements are present; in an indirect electrical connection, the intervening elements may include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used at this point of the present invention include ion beam etching, plasma etching or laser ablation.

With regard to the fabrication of transistors and integrated circuits, the term "major surface" refers to that surface of the semiconductor layer in and about which a plurality of transistors are fabricated, e.g., in a planar process. As used herein, the term "vertical" means substantially orthogonal with respect to the major surface. Typically, the major surface is along a plane of a monocrystalline silicon layer on which the field effect transistor devices are fabricated. The term "vertical transistor" refers to a transistor with individual semiconductor components vertically oriented with respect to the major surface so that the current flows vertically from source to drain. By way of example, for a VFET, the source, channel, and drain regions are formed in relatively vertical alignment with respect to the major surface.

As used herein, the term "fin structure" refers to a semiconductor material, which can be employed as the body of a semiconductor device, in which a gate structure is positioned around the fin structure such that charge flows down the channel on the two sidewalls of the fin structure and optionally along the top surface of the fin structure. The fin structures are processed to provide FinFETs. A field effect transistor (FET) is a semiconductor device in which output current, i.e., source-drain current, is controlled by the voltage applied to the gate structure to the channel of a semiconductor device. A finFET is a semiconductor device that positions the channel region of the semiconductor device in a fin structure.

It is to be understood that the present invention will be described in terms of a given illustrative architecture; however, other architectures, structures, substrate materials and process features and steps/blocks may be varied within the scope of the present invention. It should be noted that certain features may not be shown in all figures for the sake of clarity. This is not intended to be interpreted as a limitation of any particular embodiment, or illustration, or scope of the claims.

Figure 1:
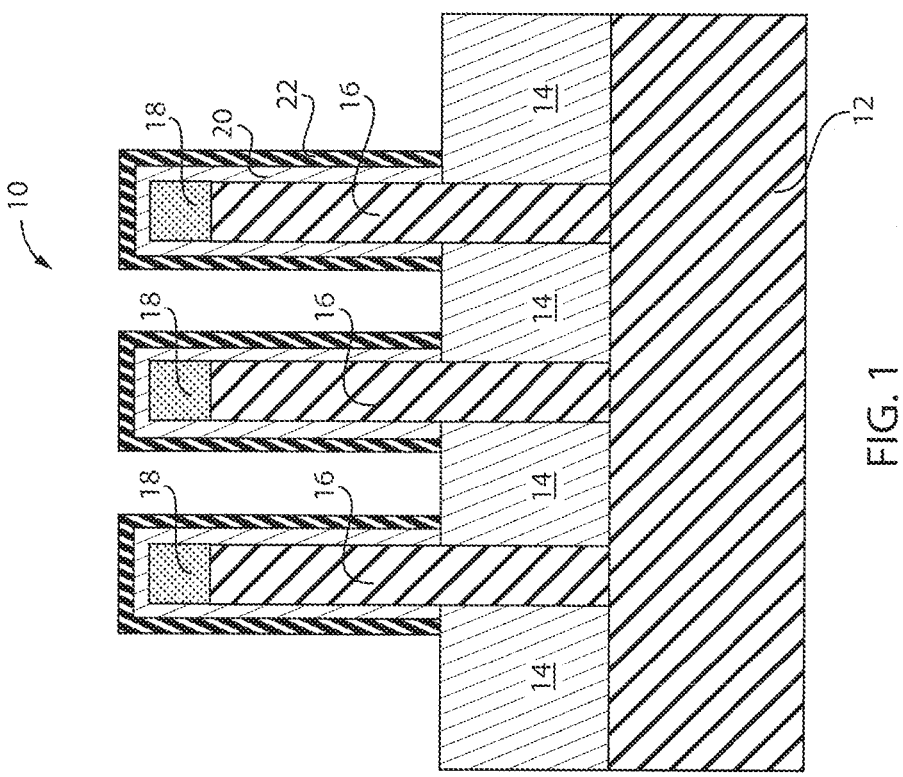
FIG. 1 is a cross-sectional view of a semiconductor structure including a plurality of vertical fins over a substrate, each fin coated with an oxide and a nitride liner, in accordance with an embodiment of the present invention.

FIG. 1 is a cross-sectional view of a semiconductor structure including a plurality of vertical fins over a substrate, each fin coated with an oxide and a nitride liner, in accordance with an embodiment of the present invention.

A semiconductor structure 10 includes a semiconductor substrate 12 with a substrate region and a trench 14 formed on the surface region of the semiconductor substrate 12. The trench 14 can include sidewalls, a bottom, and a depth. The trench 14 can be formed between a plurality of fins 16 (or fin structures). The fins 16 extend vertically from the substrate 12. Stated differently, the fins 16 are normal to or perpendicular to the substrate 12. Each of the fins 16 includes a fin cap 18 at a distal end thereof. An oxide layer 20 is deposited on the fins 16 and fin caps 18. The oxide layer 20 encompasses or envelops the fins 16 and fin caps 18. A liner 22 is deposited over the oxide 20. The liner 22 can be, e.g., a nitride liner. The nitride liner 22 encompasses or envelops the oxide 20. One skilled in the art may contemplate a number of different materials to form the oxide 20 and the liner 22, as described below.

In one or more embodiments, a substrate 12 can be a semiconductor or an insulator with an active surface semiconductor layer. The substrate 12 can be crystalline, semi-crystalline, microcrystalline, or amorphous. The substrate 12 can be essentially (i.e., except for contaminants) a single element (e.g., silicon), primarily (i.e., with doping) of a single element, for example, silicon (Si) or germanium (Ge), or the substrate 12 can include a compound, for example, Al$_2$O$_3$, SiO$_2$, GaAs, SiC, or SiGe. The substrate 12 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 12 can also have other layers forming the substrate 12, including high-k oxides and/or nitrides. In one or more embodiments, the substrate 12 can be a silicon wafer. In an embodiment, the substrate 12 is a single crystal silicon wafer.

The substrate 12 can be etched by reactive ion etching (RIE) to provide a directional etch with control of sidewall etching. In various embodiments, the substrate 12 can be etched using a dry plasma etch.

In various embodiments, the fins 16 can have a width in the range of about 6 nm to about 20 nm, or can have a width in the range of about 8 nm to about 15 nm, or in the range of about 10 nm to about 12 nm.

In various embodiments, the fins 16 can have a height in the range of about 25 nm to about 75 nm, or in the range of about 40 nm to about 50 nm.

In various embodiments, a vertical fin 16 can have two sidewalls separated by a width (i.e., thickness) and two endwalls separated by a length, where an edge of the end wall(s) can taper inwards from the base of the vertical fin 16 to the top surface, forming a trapezoidal endwall joining with inclined sidewalls. In various embodiments, the endwalls and sidewalls of the fin 16 can both taper inwards to form a pyramidal vertical fin (not shown), where the cross-sectional area at the interface of the base of the vertical fin 16 with the substrate is greater than the cross-sectional area at the interface of the top of the vertical fin and a top drain.

In various embodiments, the oxide layer 20 can be silicon oxide (e.g., SiO$_2$) or a silicon oxide/silicon borocarbonitride (SiBCN) bilayer, which can be formed by chemical vapor deposition (CVD), ALD, or a combination thereof. The silicon oxide of the bilayer can be directly on the vertical sides of the fins 16, and the SiBCN can be formed on the silicon oxide.

The liner dielectric 22 can be composed of a nitride, oxide or oxynitride material. In some embodiments, the liner dielectric can be composed of silicon oxide or silicon nitride. The liner dielectric 22 is typically formed using a conformal deposition process. The term "conformal" denotes a layer having a thickness that does not deviate from greater than or less than 30% of an average value for the thickness of the layer. The liner dielectric 22 can be formed using a deposition process, such as chemical vapor deposition, or the liner dielectric 22 can be formed using a growth process, such as thermal oxidation. In the instant case, the liner dielectric 22 is, e.g., a nitride liner.

The vertical fins 16 can be formed by a sidewall image transfer (SIT) process. An active semiconductor layer can be epitaxially grown on the substrate to a predetermined thickness, where the source can be buried beneath the active layer. A fin template layer, which can be a hard mask layer, can be formed on the active layer. A mandrel layer can be formed on the fin template layer, where the mandrel layer can be, for example, amorphous silicon or silicon germanium, for forming dummy mandrels. A mandrel template layer can be formed on the mandrel layer, where the mandrel template layer can be a hard mask layer. A soft mask layer can be formed on the mandrel template layer, where the soft mask layer can be patterned and developed to form a mandrel pattern exposing portions of the mandrel template layer. The mandrel pattern can be transferred from the soft mask layer to the mandrel template layer and mandrel layer by anisotropic directional etching, for example, a dry plasma etch or reactive ion etch (RIE), to form one or more dummy mandrels. Spacers can be formed on the sidewalls of the mandrels, for example, by a blanket or conformal deposition and etch back. The spacers can form a fin pattern that can be transferred to the fin template layer to form fin templates and the active layer to form a plurality of vertical fins by RIE.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

In one or more embodiments, formation of the vertical fins 16 by RIE using the spacers and/or fin templates can provide a tapered profile or a vertical profile by adjusting and/or controlling the etching process as would be known in the art.

FIG. 2 is a cross-sectional view of the semiconductor structure of FIG. 1 where a sacrificial material is deposited, planarized, and back etched, in accordance with an embodiment of the present invention.

In various embodiments, a sacrificial material 24 is deposited over the trench regions 14 formed between the plurality of fins 16. The sacrificial material 24 is planarized and etched back for formation over the trench regions 14. The sacrificial material 24 ultimately defines a bottom source/drain region. The sacrificial material 24 can be, e.g., amorphous Si or poly-Si.

The planarization can be achieved by wet etching, for example, a sulfuric acid, hydrogen peroxide mixture (SPM) cleaning process, or the planarization can be achieved by ashing.

Figure 3:
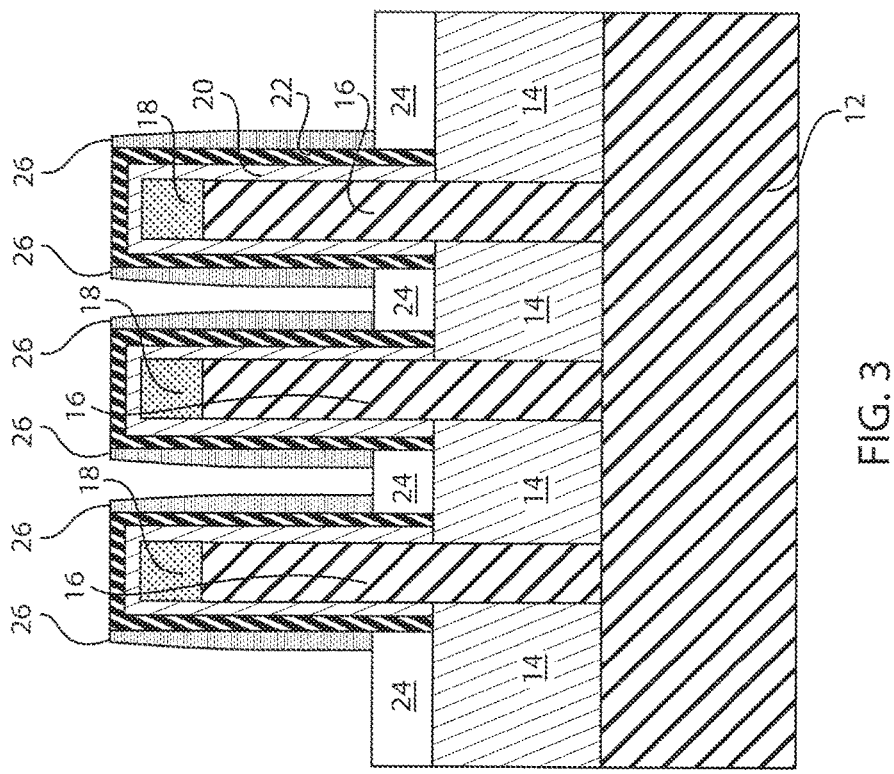
FIG. 3 is a cross-sectional view of the semiconductor device of FIG. 2 where sidewall spacers are formed adjacent portions of the nitride liner, in accordance with an embodiment of the present invention.

FIG. 3 is a cross-sectional view of the semiconductor device of FIG. 2 where sidewall spacers are formed adjacent portions of the nitride liner, in accordance with an embodiment of the present invention.

In various embodiments, spacer sidewalls 26 are formed on opposed ends of the fins 16, such that the spacer sidewalls 26 contact or engage a portion of the nitride liner 22. A protective liner (not shown) can be deposited and etched to form the sidewall spacers 26. The protective liner can be, e.g., hafnium oxide ($HfO_2$). Spacer patterning is a technique employed for patterning features with linewidths smaller than can be achieved by conventional lithography. In the most general sense, the spacer is a layer that is deposited over a pre-patterned feature, often called the mandrel. The spacer is subsequently etched back so that the spacer portion covering the mandrel is etched away while the spacer portion on the sidewall remains. The mandrel can then be removed, leaving two spacers (one for each edge) for each mandrel.

Figure 4:
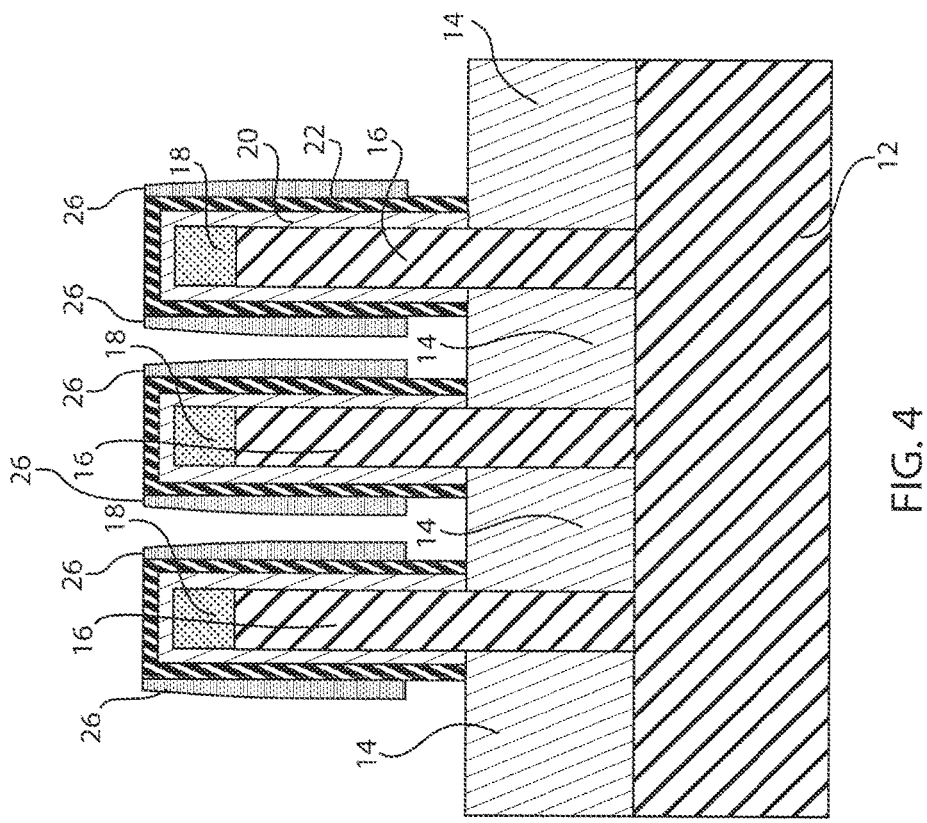
FIG. 4 is a cross-sectional view of the semiconductor device of FIG. 3 where the sacrificial material is selectively removed, in accordance with an embodiment of the present invention.

FIG. 4 is a cross-sectional view of the semiconductor device of FIG. 3 where the sacrificial material is selectively removed, in accordance with an embodiment of the present invention.

In various embodiments, the first sacrificial material 24 is selectively removed such that gap regions 27 are defined between the fins 16.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Figure 5:
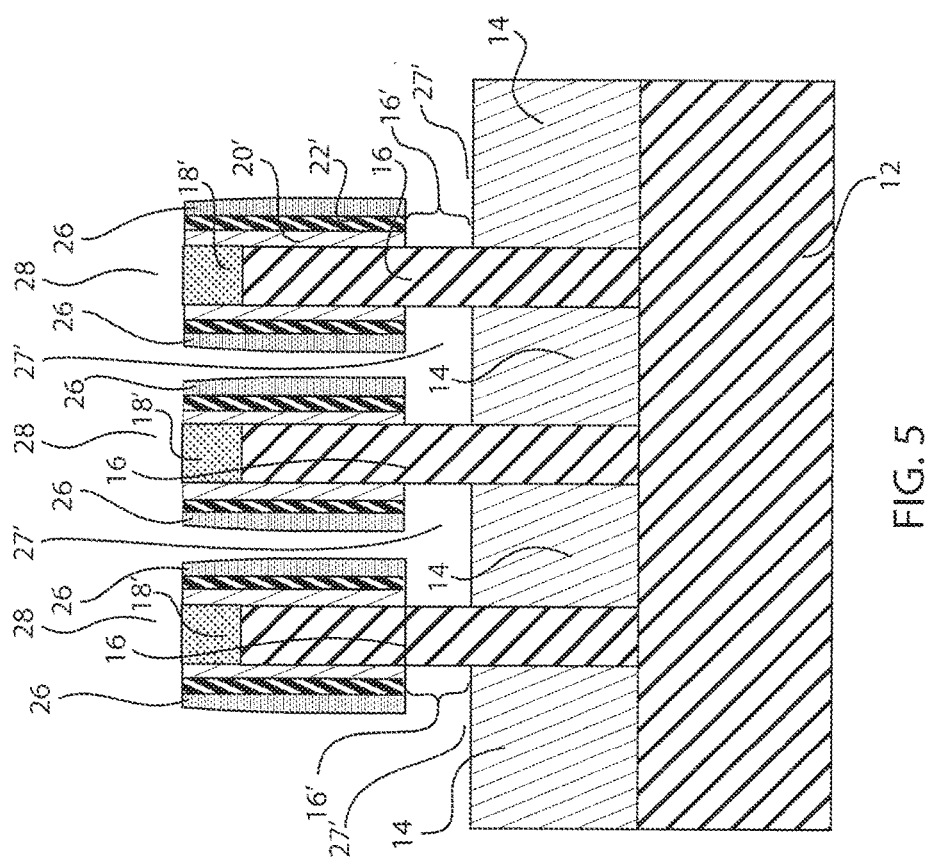
FIG. 5 is a cross-sectional view of the semiconductor device of FIG. 4 where exposed portions of the oxide and nitride liner are selectively removed, in accordance with an embodiment of the present invention.

FIG. 5 is a cross-sectional view of the semiconductor device of FIG. 4 where exposed portions of the oxide and nitride liner are selectively removed, in accordance with an embodiment of the present invention.

In various embodiments, exposed portions of the oxide layer 20 and the nitride liner 22 are selectively removed. In the instant case, there are two exposed portions. A top portion of 20, 22 is located on a top portion of the fin cap 18. A bottom portion of 20, 22 is located adjacent central fin sections 16' of the fins 16. Removal of the top portions of 20, 22 defines gaps or recesses 28 over the modified or slightly etched fin cap 18'. Removal of the bottom portions of 20, 22 defines gaps 27' between the central fin sections 16' adjacent the top trench regions 14. The remaining oxide layer 20' and the remaining nitride liner 22' are shown extending along an upper length of each fin 16.

Therefore, the portion of the oxide layer 20 over the fin caps 18 can be removed to expose the fin caps 18. In various embodiments, the portion of the oxide layer 20 can be removed by chemical-mechanical polishing (CMP) and/or etching, where the portion of the oxide layer 20 can be removed at the same time as the nitride liner 22, or by a subsequent process. Moreover, a top portion of the fin cap 18 can be trimmed, which results in remaining fin cap portion 18'.

In another embodiment, the oxide layer 20 can be recessed using a selective etch process to provide an exposed portion, i.e., reveal portion, of the remaining upper portion 18' of each fin structure 16. In some embodiments, the oxide layer 20 is removed by an etch that is selective to the fin cap 18 that is present on each fin structure 16. The etch process can also remove the nitride liner 22. In some embodiments, this can be done using hot phosphorus. The etch process for recessing the oxide layer 20 can be an anisotropic etch or an isotropic etch. In some examples, the etch process can be a wet chemical etch, reactive ion etch (RIE), plasma etch, laser etch and combinations thereof.

Figure 6:
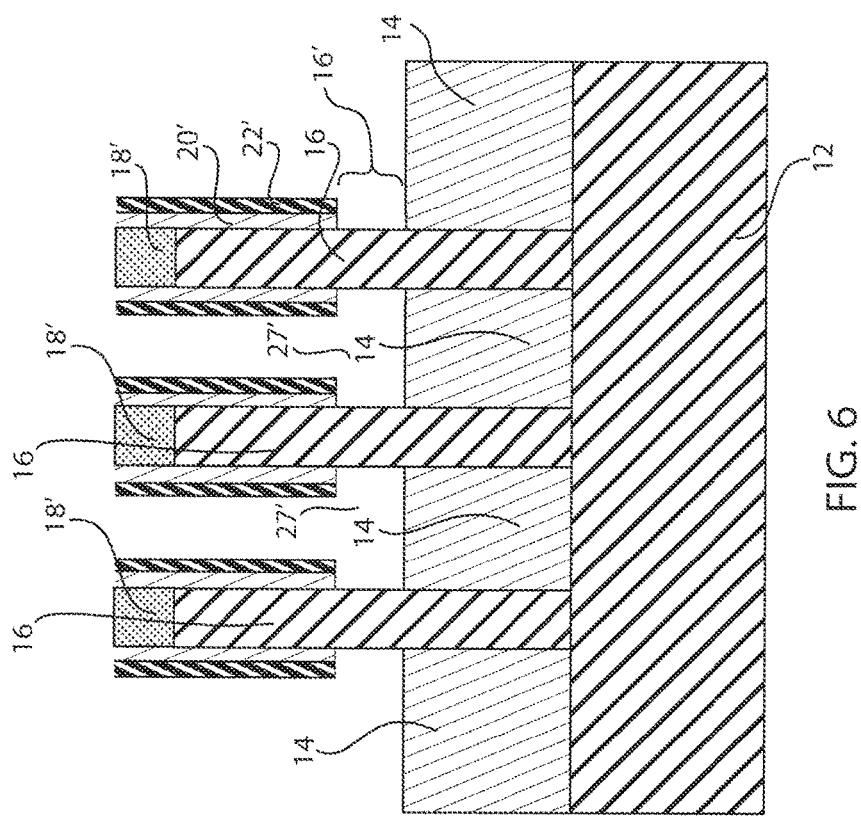
FIG. 6 is a cross-sectional view of the semiconductor device of FIG. 5 where the spacer sidewalls are removed, in accordance with an embodiment of the present invention.

FIG. 6 is a cross-sectional view of the semiconductor device of FIG. 5 where the spacer sidewalls are removed, in accordance with an embodiment of the present invention.

In various embodiments, the remaining spacer sidewalls 26 are removed to expose the remaining oxide layer 20' and the remaining nitride liner 22'. Moreover, it is noted that the exposed fin section (i.e., central section 16') can be selectively trimmed in one or more embodiments. Such trimming may be utilized to influence the placement of the bottom source/drain junction. In the instant case, it can be assumed that no trimming takes place.

Figure 7:
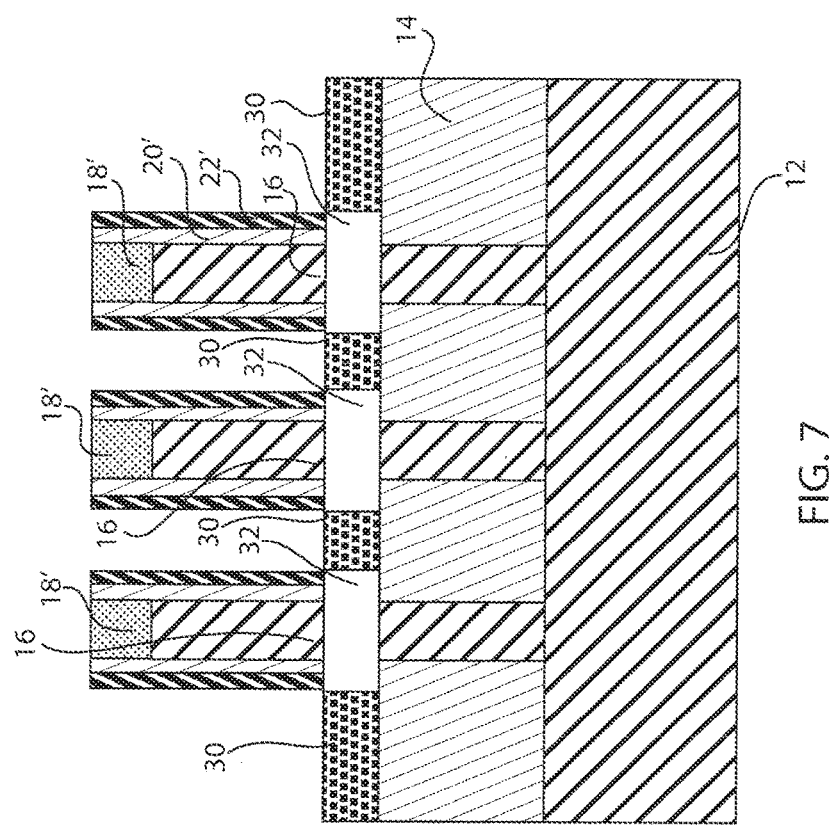
FIG. 7 is a cross-sectional view of the semiconductor device of FIG. 6 where a first source/drain region is epitaxially grown, in accordance with an embodiment of the present invention.

FIG. 7 is a cross-sectional view of the semiconductor device of FIG. 6 where a first source/drain region is epitaxially grown, in accordance with an embodiment of the present invention.

In various embodiments, an in-situ doped source/drain 32 is deposited or formed via epitaxial growth. Depending on how the epitaxial growth develops, it may be necessary to anisotropically etch the epitaxial growth, in order to result in a top surface of the source/drain region that is suitable for subsequent processing. There are two types of epitaxial regions. The first region 30 is defined over the trench regions 14 and adjacent the fins 16. The second region 32 is defined along a longitudinal axis extending through the fin 16. The second region 16 is formed at about the central section 16' of the fin 16. In one example, the second region 32 has a width that is greater than the width of the fin 16. The width of the second region can be substantially equal to the total width of the fin 16, the oxide layer 20', and the nitride liner 22'.

The doped region 32 can be formed below the vertical fin(s) 16. The dopant can be provided to the doped region(s) 32 (i.e., source/drain region(s)) by ion implantation, and source/drains formed by annealing the doped region(s) 32. In various embodiments, the doped region 32 can be n-doped or p-doped. The doped region 32 can form a bottom source/drain. It should be noted that the source and drain can be interchangeable between the top and bottom locations of a vertical fin, where the doped region in the substrate can act as a source or a drain.

In various embodiments, the bottom source can be doped in-situ or ex-situ, for example, through ion implantation or thermal diffusion of dopants into the substrate. The dopant of the source can be activated by annealing. Other suitable doping techniques can also be used, including but not limited to, gas phase doping, plasma doping, plasma immersion ion implantation, cluster doping, infusion doping, liquid phase doping, solid phase doping, or combinations thereof.

Forming the source and drain regions 32 can include forming an in situ doped epitaxial semiconductor material on the source and drain region portions of the fin structures 16. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain regions 32 can be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources can be used for the epitaxial deposition of the epitaxial semiconductor material that provides the source and drain regions 32.

Examples of silicon including source gasses can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gasses for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition can result in crystal defects and film cracking.

The epitaxial semiconductor material that provides the source and drain regions 32 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gasses.

As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. The p-type gas dopant source can include diborane ($B_2H_6$). In some embodiments, the epitaxial deposition process for forming the epitaxial semiconductor material for the source and drain regions 32 can continue until the epitaxial semiconductor material that is formed on adjacent fin structures contact one another to form merged epitaxial semiconductor material.

As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

Figure 8:
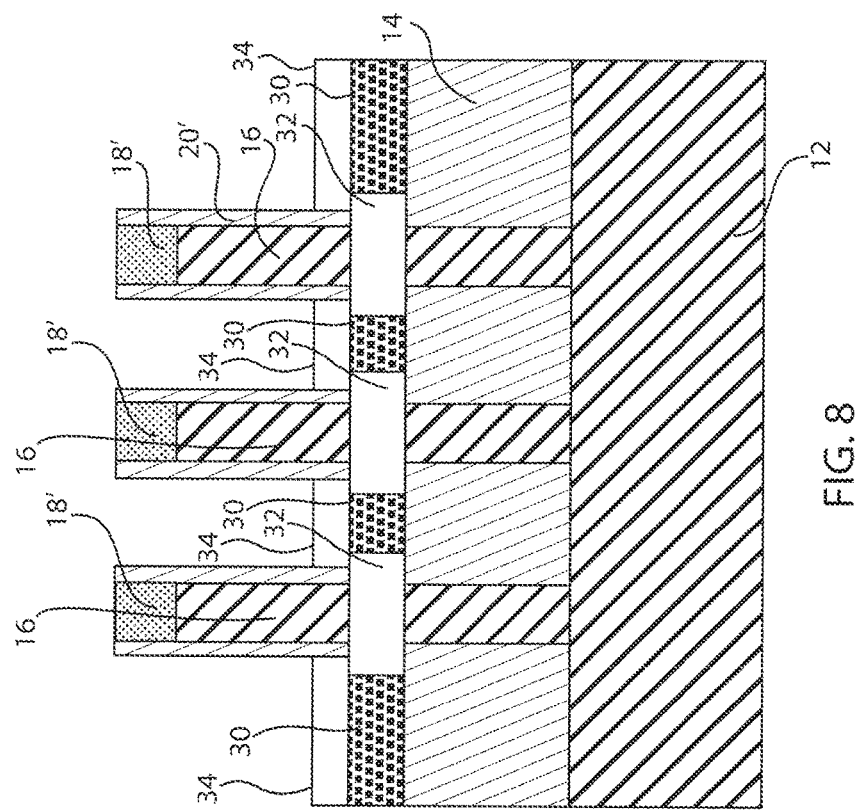
FIG. 8 is a cross-sectional view of the semiconductor device of FIG. 7 where a first spacer is deposited, planarized, and back etched, in accordance with an embodiment of the present invention.

FIG. 8 is a cross-sectional view of the semiconductor device of FIG. 7 where a first spacer is deposited, planarized, and back etched, in accordance with an embodiment of the present invention.

In various embodiments, the nitride liner 22' is removed and a bottom spacer fill takes place. In other words, a first spacer or bottom spacer 34 is deposited, planarized, and etched back so that the bottom spacer 34 is filled between the fins 16. The bottom spacer 34 can be, e.g., a nitride film. Thus, by etching back the bottom spacer 34, the nitride liner 22' is also removed by the etching. The bottom spacer 34 can be formed on the epitaxial growth 30. In an embodiment, the bottom spacer 34 can be an oxide, for example, silicon oxide (SiO), a nitride, for example, a silicon nitride (SiN), or an oxynitride, for example, silicon oxynitride (SiON).

The planarization process can be provided by chemical mechanical planarization (CMP). Other planarization process can include grinding and polishing.

In one or more embodiments, the bottom spacer 34 can have a thickness in the range of about 3 nm to about 10 nm, or in the range of about 3 nm to about 5 nm. The thickness of the bottom spacer 34 can define a distance between the surface of the substrate 12 to the start of a metal gate, described below.

FIG. 9 is a cross-sectional view of the semiconductor device of FIG. 8 where a dummy gate stack is deposited, planarized, and back etched, in accordance with an embodiment of the present invention.

In various embodiments, a dummy gate stack 36 is deposited between the fins 16. The dummy stack 36 can be, e.g., amorphous Si. The thickness of the amorphous Si can define a length of the gate. The dummy gate stack 36 is planarized (via CMP) and etched back to be formed between the fins 16. The dummy gate stack 36 has a thickness that is greater than the thickness of the bottom spacer 34. The dummy gate stack 36 can also have a thickness that is greater than the thickness of the source and drain regions 32.

FIG. 10 is a top view of the semiconductor device of FIG. 9 illustrating the dummy gate stack, in accordance with an embodiment of the present invention.

The top view illustrates a dummy stack region 38 on the dummy gate stack 36 that is masked off from the gate recess/etch back process. The top surface of the dummy stack region 38 is thus coplanar with the top surface of the fin caps 18' and the remaining oxide layer 20'. The rest of the dummy gate stack 36 is recessed to a depth which defines the gate length 37, as shown in FIG. 11.

Figure 11:
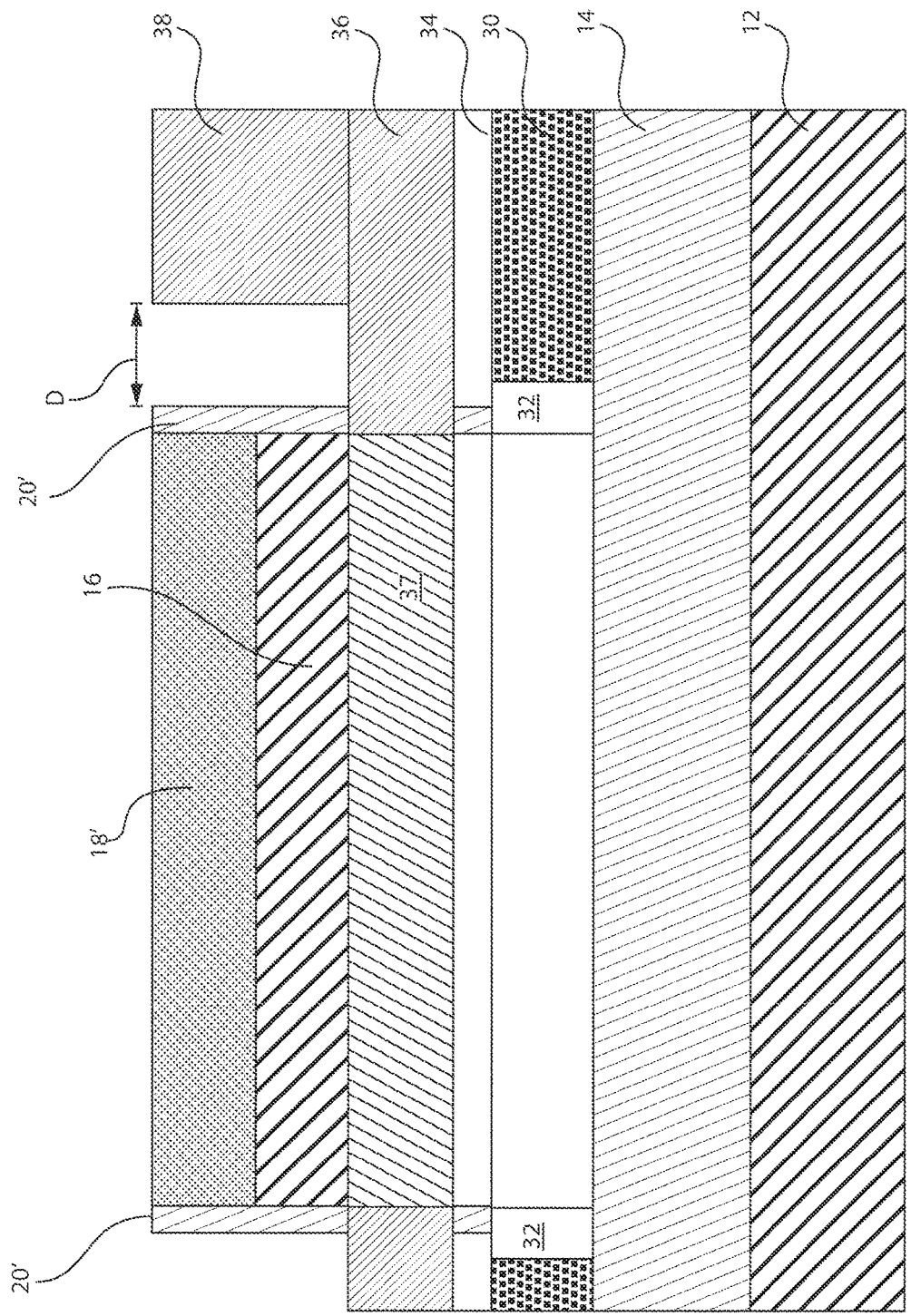
FIG. 11 is a side view of the semiconductor device of FIG. 9 illustrating first and second portions of the dummy gate stack, in accordance with an embodiment of the present invention.

FIG. 11 is a side view of the semiconductor device of FIG. 9 illustrating first and second portions of the dummy gate stack, in accordance with an embodiment of the present invention.

The side view illustrates the dummy stack region 38 extending up to a top surface of the remaining fin cap 18' and the remaining oxide layer 20'. The dummy stack region 38 can have a thickness that is greater than the thickness of the dummy gate stack 36. As noted above, the dummy stack region 38 is masked from the recess etch process. The dummy stack region 38 contacts or engages a portion of the dummy gate stack 36. Additionally, the dummy stack region 38 is separated from the fin structures 16 by a certain distance, "D."

Figure 12:
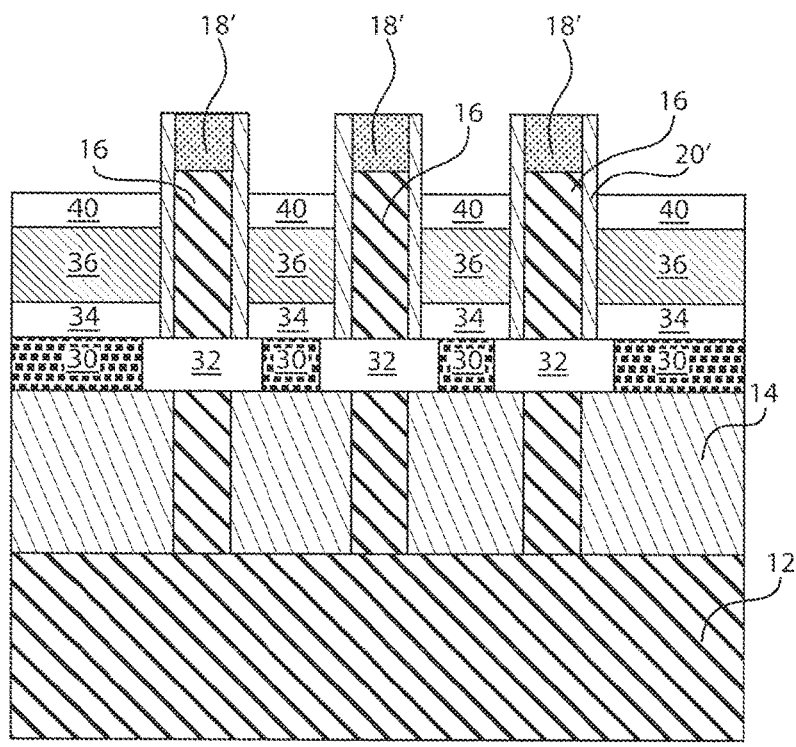
FIG. 12 is a cross-sectional view of the semiconductor device of FIG. 9 where a second spacer is deposited over the dummy gate stack, planarized, and back etched, in accordance with an embodiment of the present invention.

FIG. 12 is a cross-sectional view of the semiconductor device of FIG. 9 where a second spacer is deposited over the dummy gate stack, planarized, and back etched, in accordance with an embodiment of the present invention.

In various embodiments, a top spacer fill takes place. The top spacer is a second spacer 40, which is deposited, planarized, and etched back so that the top spacer 40 is filled between the fins 16 and over the dummy gate stack 36. The top spacer 40 can be, e.g., a nitride film. In an embodiment, the top spacer 40 can be an oxide, for example, silicon oxide (SiO), a nitride, for example, a silicon nitride (SiN), or an oxynitride, for example, silicon oxynitride (SiON).

The planarization process can be provided by chemical mechanical planarization (CMP). Other planarization process can include grinding and polishing.

In one or more embodiments, the top spacer 40 can have a thickness in the range of about 3 nm to about 10 nm, or in the range of about 3 nm to about 5 nm.

Figure 13:
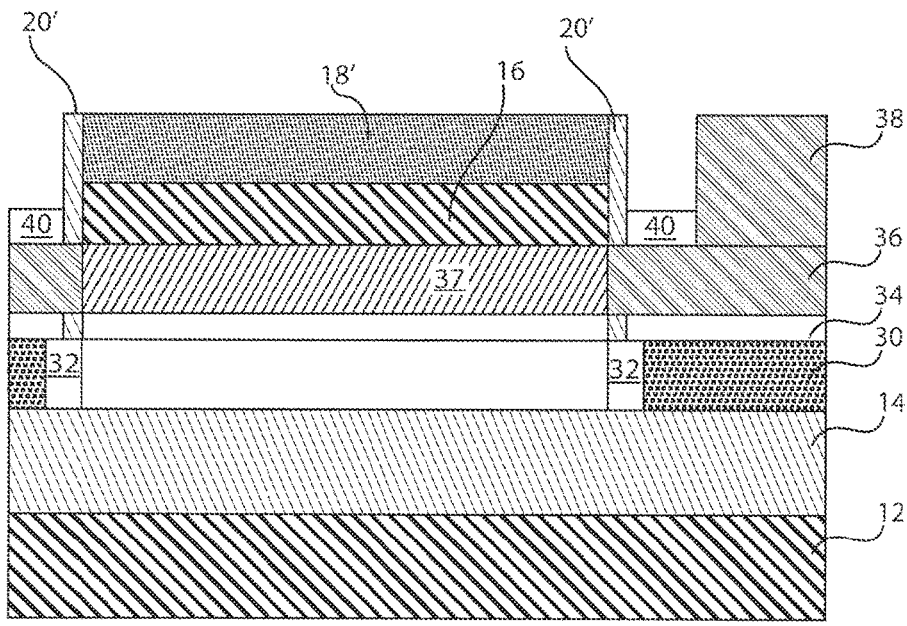
FIG. 13 is a side view of the semiconductor device of FIG. 12, in accordance with an embodiment of the present invention.

FIG. 13 is a side view of the semiconductor device of FIG. 12, in accordance with an embodiment of the present invention.

The side view illustrates the dummy stack region 38 extending up to a top surface of the remaining fin cap 18' and the remaining oxide layer 20'. The dummy stack region 38 can have a thickness that is greater than the thickness of the dummy gate stack 36. As noted above, the dummy stack region 38 is masked from the recess etch process. The dummy stack region 38 contacts or engages a portion of the dummy gate stack 36. The dummy stack region 38 further contacts the top spacer 40. The top spacer 40 extends between the dummy stack region 38 and the remaining oxide layer 20'.

Figure 14:
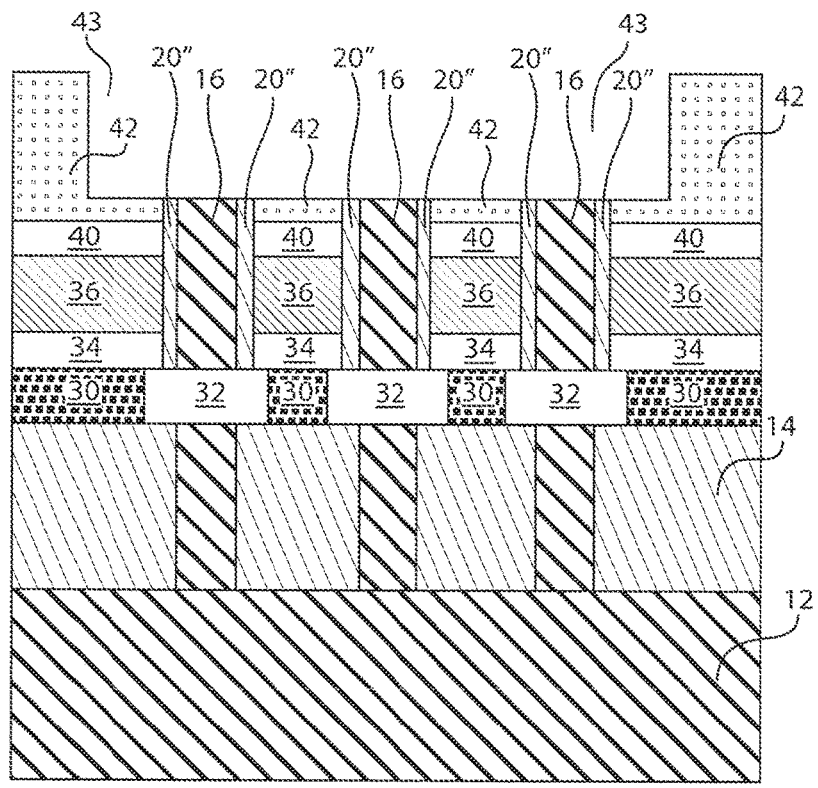
FIG. 14 is a cross-sectional view of the semiconductor device of FIG. 12 where an inter-layer dielectric (ILD) is deposited and planarized, and an opening is patterned for a second source/drain region, in accordance with an embodiment of the present invention.

FIG. 14 is a cross-sectional view of the semiconductor device of FIG. 12 where an inter-layer dielectric (ILD) is deposited and planarized, and an opening is patterned for a second source/drain region, in accordance with an embodiment of the present invention.

In various embodiments, a first inter-layer dielectric (ILD) oxide fill takes place. The ILD oxide 42 is planarized. The ILD oxide 42 fills the remaining gap or recess between the fins 16. The ILD oxide 42 extends beyond a top surface of the fins 16 at the edges of the semiconductor structure 10. The height of the ILD oxide 42 at the edges of the semiconductor structure 10 is greater than the height of the dummy stack region 38. The opening 43 created by the ILD oxide 42 is configured to receive the top source/drain region, as described below.

In one or more embodiments, the remaining fin caps 18' can be removed to expose a top portion of the fins 16 and a top portion or edge of the oxide 20". The remaining fin caps 18' can be removed by etching, such as a dry plasma etch. After removal of the remaining fin caps 18', the sides of the oxide layer 20" can be exposed. Thus, the oxide layer portion 20' has been further etched back to oxide layer 20".

In various embodiments, the height of the ILD oxide fill 42 can be reduced by chemical-mechanical polishing (CMP) and/or etching. Therefore, the planarization process can be provided by CMP. Other planarization process can include grinding and polishing.

In one or more embodiments, the ILD oxide 42 can have a thickness in the range of about 3 nm to about 10 nm, or in the range of about 3 nm to about 5 nm. In one example embodiment, the ILD oxide 42 has a thickness (between the fins 16) substantially equal to the thickness of the bottom spacer 34 and the top spacer 40. Thus, the top spacer 40 can also have a thickness that is substantially equal to the thickness of the bottom spacer 34.

The ILD 42 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 42 include any of the aforementioned materials in porous form, or in a form that changes during processing to or from being porous and/or permeable to being non-porous and/or non-permeable.

Figure 15:
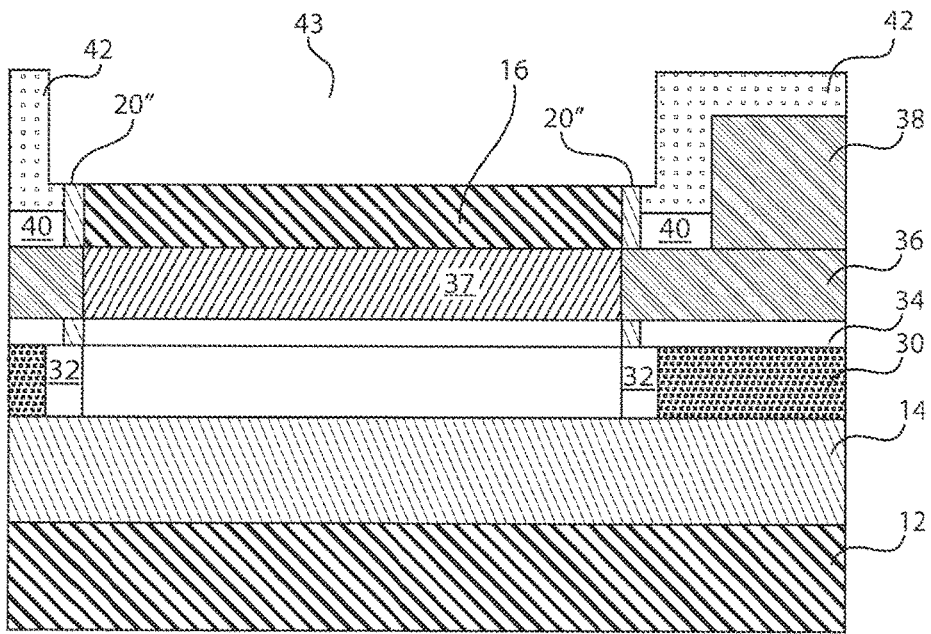
FIG. 15 is a side view of the semiconductor device of FIG. 14 illustrating the ILD over portions of the dummy stack, in accordance with an embodiment of the present invention.

FIG. 15 is a side view of the semiconductor device of FIG. 14 illustrating the ILD over portions of the dummy stack, in accordance with an embodiment of the present invention.

The side view illustrates the ILD oxide 42 extending beyond a top surface of the fins 16 at the edges of the semiconductor structure 10. The height of the ILD oxide 42 at the edges of the semiconductor structure 10 is greater than the height of the dummy stack region 38. The ILD oxide 42 is formed over the dummy stack region 38 such that the ILD oxide 42 encompasses or envelopes or surrounds the entire dummy stack region 38. The ILD oxide 42 also overlaps the top spacer 40, which is positioned over a portion of the dummy gate stack 36. The dummy gate stack 36 can have a thickness greater than the thickness of the bottom spacer 34 and the top spacer 40. The dummy gate stack 36 can extend along a length or width of the semiconductor structure 10.

Figure 16:
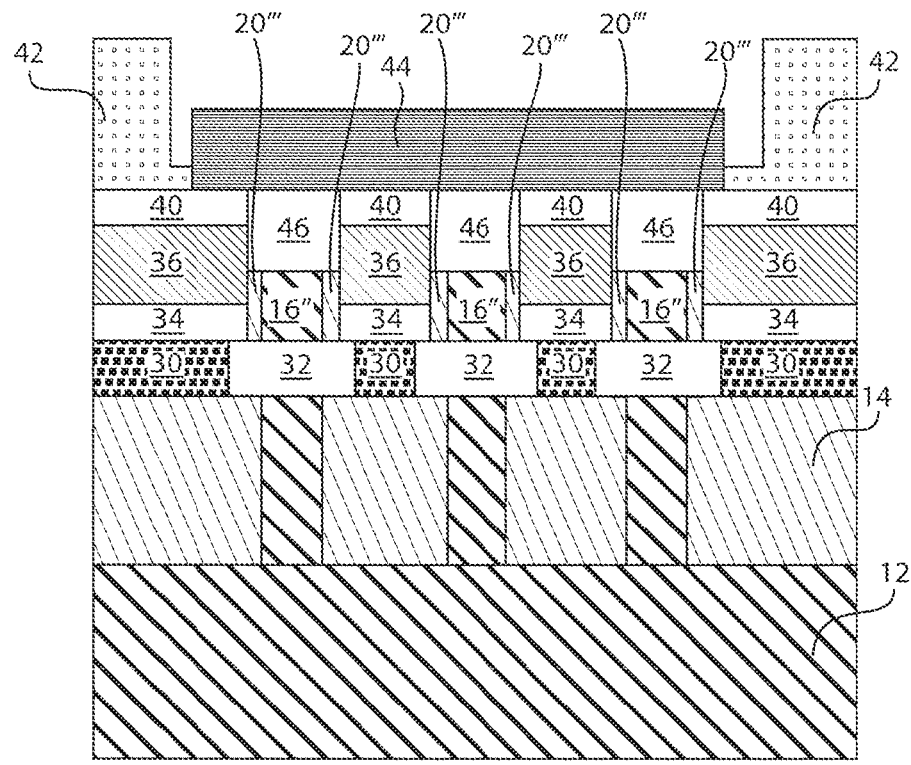
FIG. 16 is a cross-sectional view of the semiconductor device of FIG. 14 where the second source/drain region is epitaxially formed, in accordance with an embodiment of the present invention.

FIG. 16 is a cross-sectional view of the semiconductor device of FIG. 14 where the second source/drain region is epitaxially formed, in accordance with an embodiment of the present invention.

In one or more embodiments, a doped material forming a top source/drain 46 can be formed on the one or more vertical fin(s) 16. The top source/drain 46 can be formed by epitaxial growth 44 on the vertical fin 16, such that the vertical fin 16 and the top source/drain 46 have the same crystal orientation. The top source/drain can be n-doped or p-doped.

In various embodiments, the locations of the source and drain of a vertical transistor can be reversed such that the drain is on the top of a vertical fin, while the source is at the bottom. The source can, therefore, be at the bottom or the top.

Additionally, in one or more embodiments, the fins 16 and the remaining oxide layer 20" are trimmed backed or etched back to accommodate the epitaxial growth 44. The etched back fins 16" and the remaining oxide layer 20‴ remain. The epitaxial growth 44 takes place between the ILD oxide 42 formed on the edges of the semiconductor structure 10.

Figure 17:
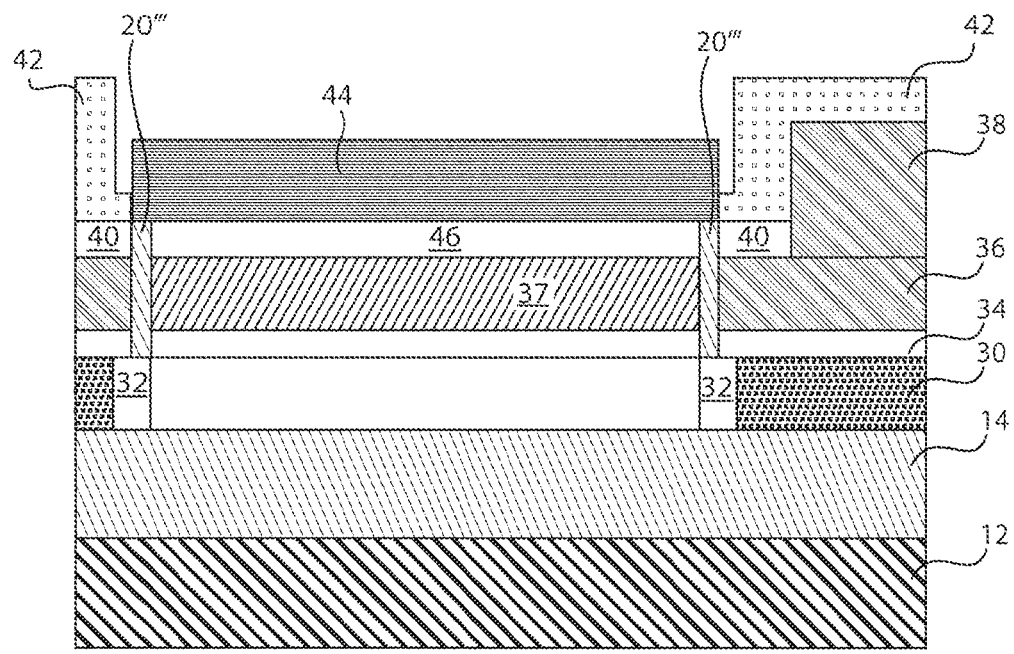
FIG. 17 is a side view of the semiconductor device of FIG. 16, in accordance with an embodiment of the present invention.

FIG. 17 is a side view of the semiconductor device of FIG. 16, in accordance with an embodiment of the present invention.

The side view illustrates the ILD oxide 42 extending beyond a top surface of the trimmed fins 16" at the edges of the semiconductor structure 10. The height of the ILD oxide 42 is greater than the height of the epitaxial growth 44. The epitaxial growth 44 is formed within the edges defining the ILD oxide 42. The epitaxial growth 44 is formed over the fins 16. The epitaxial growth 44 does not contact or engage the edges defining the ILD oxide 42. The dummy gate stack 36 can have a thickness greater than the thickness of the epitaxial growth 44.

Figure 18:
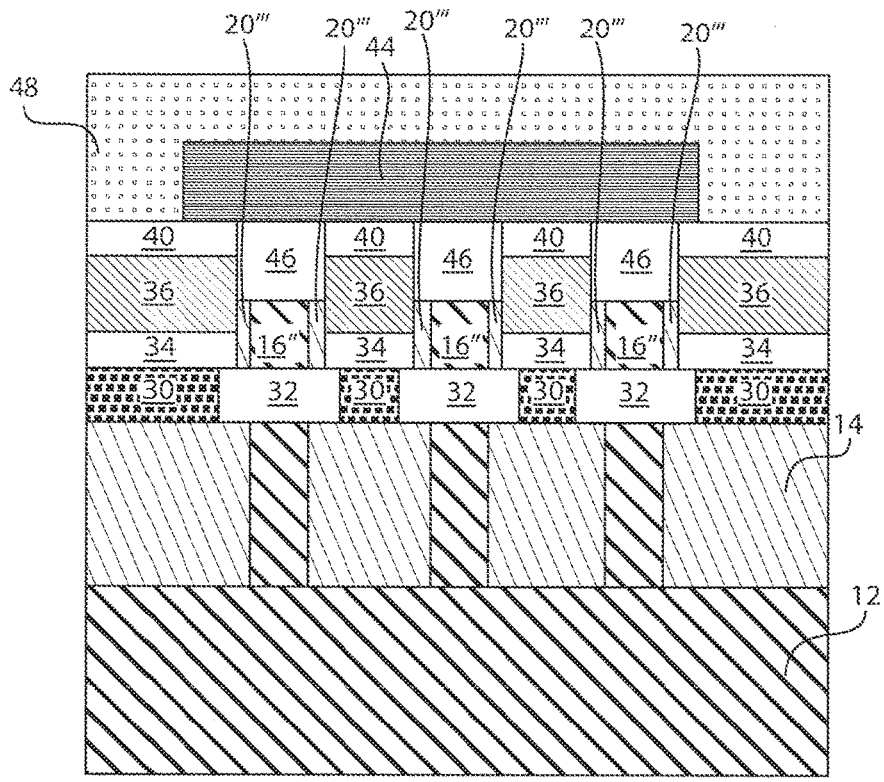
FIG. 18 is a cross-sectional view of the semiconductor device of FIG. 16 where another ILD is deposited and planarized, and where an opening is etched through the ILD to expose a portion of the dummy gate stack, in accordance with an embodiment of the present invention.

FIG. 18 is a cross-sectional view of the semiconductor device of FIG. 16 where another ILD is deposited and planarized, and where an opening is etched through the ILD to expose a portion of the dummy gate stack, in accordance with an embodiment of the present invention.

In various embodiments, a second inter-layer dielectric (ILD) oxide fill takes place. The ILD oxide 48 is planarized. The ILD oxide 48 fills the remaining gap or recess between the edges of first ILD oxide 42. The ILD oxide 48 encompasses or envelops the entire epitaxial growth 44. The height of the ILD oxide 48 is substantially equal to the height at the edges of the first ILD oxide 42 at the edges of the semiconductor structure 10. The height of the ILD oxide 48 is greater than the height of the dummy stack region 38. An opening 50 (FIG. 19) is created by the ILD oxide 48 over the dummy stack region 38.

In various embodiments, the height of the ILD oxide fill 48 can be reduced by chemical-mechanical polishing (CMP) and/or etching. Therefore, the planarization process can be provided by CMP. Other planarization process can include grinding and polishing.

Figure 19:
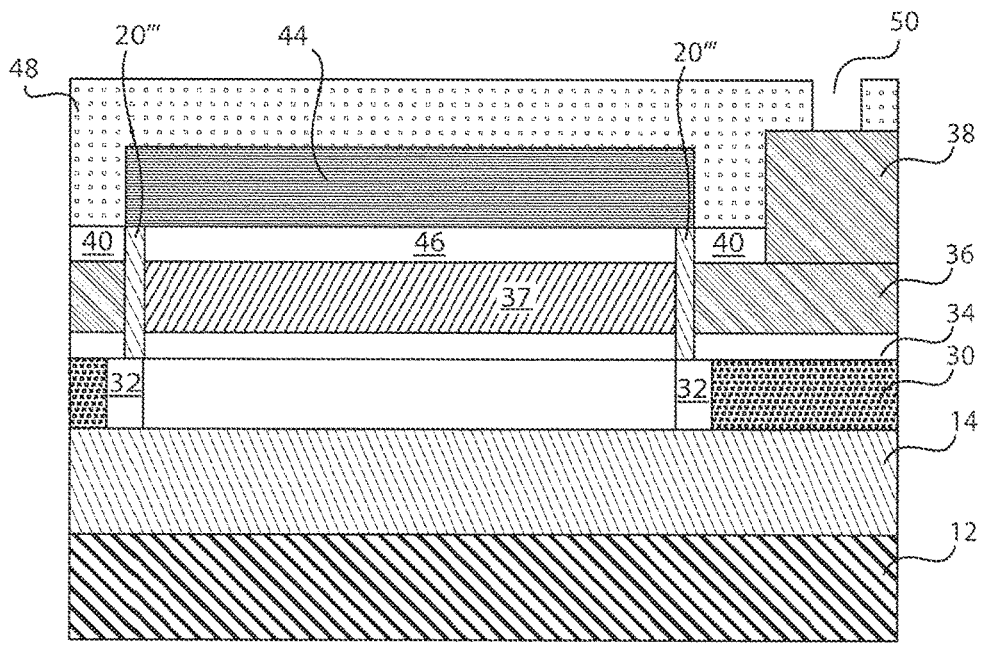
FIG. 19 is a side view of the semiconductor device of FIG. 18, in accordance with an embodiment of the present invention.

FIG. 19 is a side view of the semiconductor device of FIG. 18, in accordance with an embodiment of the present invention.

The side view illustrates that the ILD oxide 48 encompasses or envelops the entire epitaxial growth 44. Also, the height of the ILD oxide 48 is substantially equal to the height at the edges of the first ILD oxide 42 at the edges of the semiconductor structure 10. Moreover, the height of the ILD oxide 48 is greater than the height of the dummy stack region 38 and an opening 50 is created or etched into the ILD oxide 48 over the dummy stack region 38. The opening 50 provides access to the dummy gate region 38. Stated differently, the opening 50 exposes the top surface of the dummy stack region 38. The width of the opening 50 can be less than the width of the dummy stack region 38.

Figure 20:
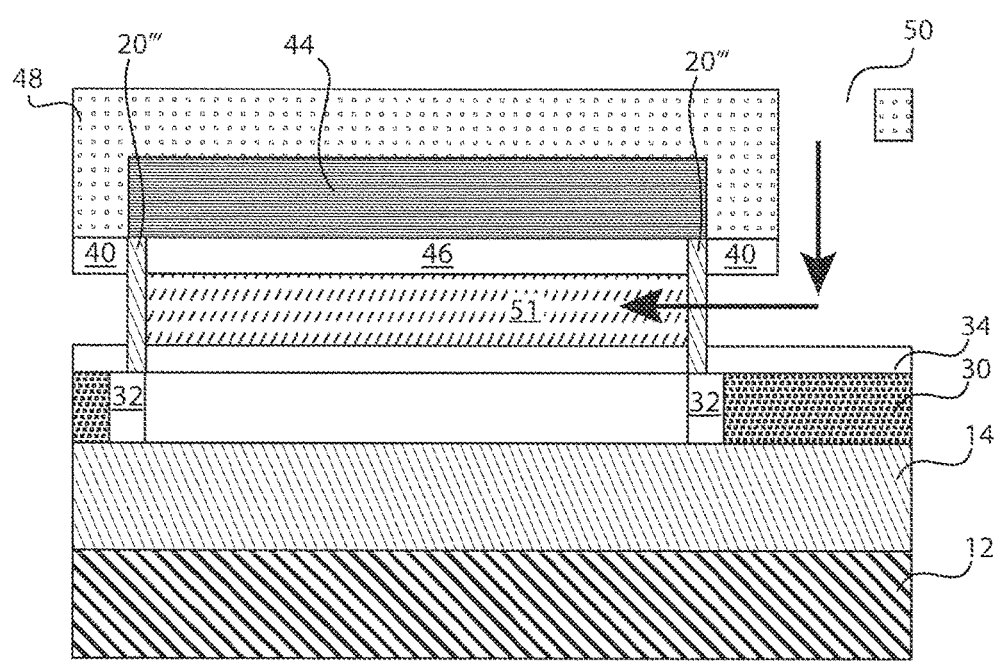
FIG. 20 is a side view of the semiconductor device of FIG. 18 illustrating a subway etch to remove the dummy gate stack, in accordance with an embodiment of the present invention.

FIG. 20 is a side view of the semiconductor device of FIG. 18 illustrating a subway etch to remove the dummy gate stack, in accordance with an embodiment of the present invention.

The side view illustrates removal of the dummy stack region 38 and the dummy gate stack 36 via a subway etch to access the dummy gate oxide 51 covering the fin channel sidewalls.

Figure 21:
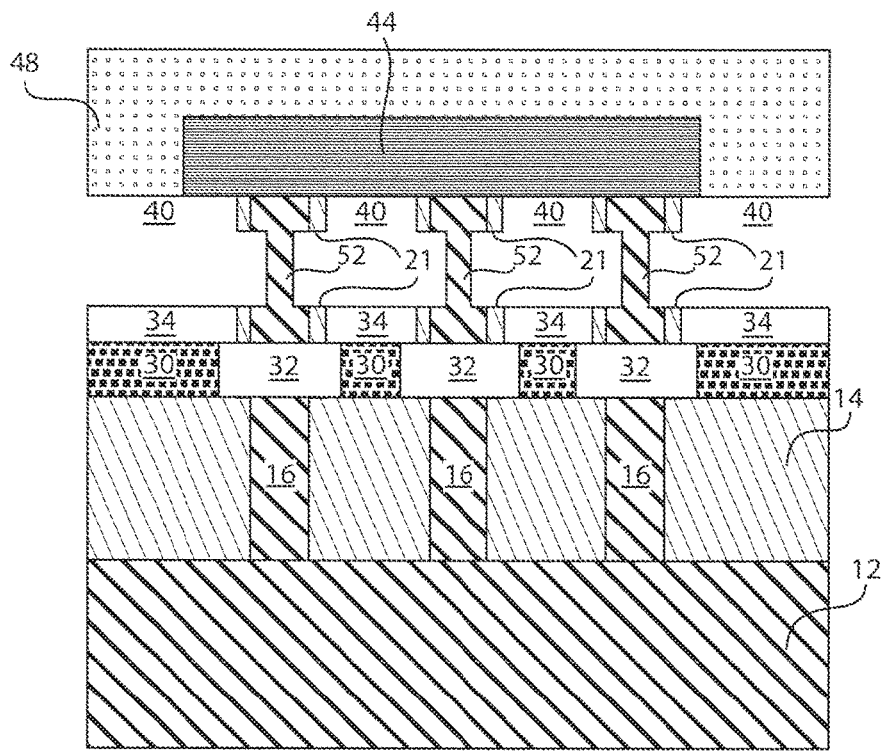
FIG. 21 is a cross-sectional view of the semiconductor device of FIG. 18 illustrating the formation of dumbbell fins, in accordance with an embodiment of the present invention.

FIG. 21 is a cross-sectional view of the semiconductor device of FIG. 18 illustrating the formation of dumbbell fins, in accordance with an embodiment of the present invention.

In various embodiments, after the subway etch takes place, and the dummy stack region 38 and the dummy gate stack 36 are removed, fin structures 52 remain. Fin structures 52 can be referred to as "dumbbells" or "dumbbell fin structures." Each fin of the plurality of fins includes a first section having a first width, a second section having a second width, and a third section having a third width, the first and third sections connected to each other by the second section to form the dumbbell fin structure 52. The first width is substantially equal to the third width, and the first and third widths are greater than the second width. The second width is self-aligned to the HKMG stack. The dumbbell fin structures 52 can be formed by over-etching during the dummy gate oxide 51 removal. The dumbbell fin structures 52 further expose the source/drain regions 32 and 46, as well as the bottom spacers 34 and the top spacers 40. The first source/drain region 32 engages the first section of the dumbbell fin structure 52 and the second source/drain structure engages the third section of the dumbbell fin structure 52. Additionally, oxide portions 21 remains on the side walls of the first and third sections of the dumbbell fin structure 52. The oxide portions 21 separate the first and third sections of the dumbbell fin structures 52 from the bottom and top spacers 32, 46, respectively.

Figure 22:
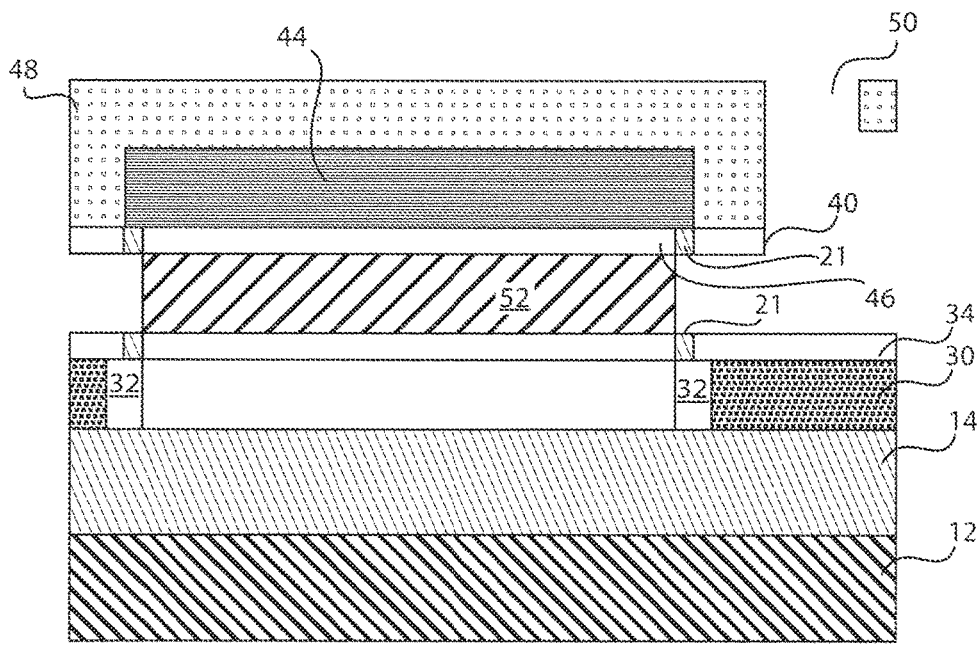
FIG. 22 is a side view of the semiconductor device of FIG. 21 illustrating the dumbbell fin formation, in accordance with an embodiment of the present invention.

FIG. 22 is a side view of the semiconductor device of FIG. 21 illustrating the dumbbell fin formation, in accordance with an embodiment of the present invention.

The side view illustrates the dumbbell fin formation 52 within the semiconductor structure 10.

Figure 23:
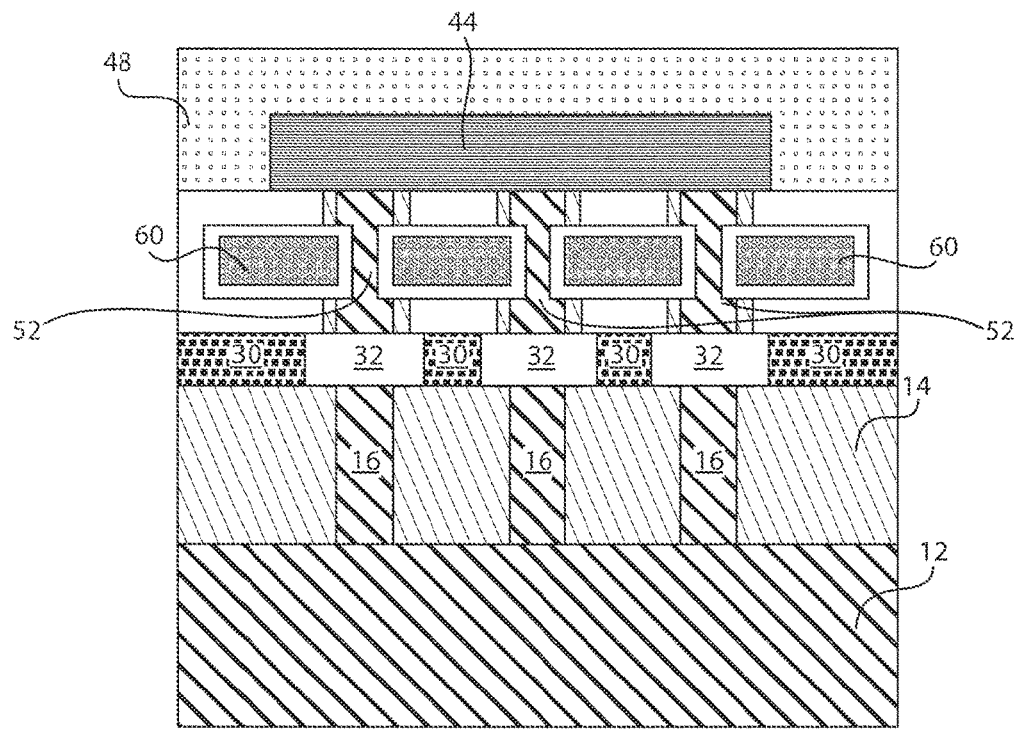
FIG. 23 is a cross-sectional view of the semiconductor device of FIG. 21 where a gate replacement process is performed, the gate replacement process including depositing a high-k metal gate (HKMG) stack within a gate cavity, in accordance with an embodiment of the present invention.

FIG. 23 is a cross-sectional view of the semiconductor device of FIG. 21 where a gate replacement process is performed, the gate replacement process including depositing a high-k metal gate (HKMG) stack within a gate cavity, in accordance with an embodiment of the present invention.

A gate fill takes place between the dumbbell fin structures 52. The gate fill involves depositing the HKMG stack 60. The HKMG stack 60 can be formed within the gate cavity formed by the removal of the dummy gate stack 36. The HKMG stack 60 engages or contacts the second section of the dumbbell fin structure 52 when disposed between the first and second spacers 34, 40. The first and second source/drain regions 32 and 46 are formed before the formation or placement of the HKMG stack 60. Thus, the HKMG stack 60 is defined by a replacement metal gate (RMG) process, the RMG process defined in part by a subway etch.

In various embodiments, the HKMG stack 60 can include but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide (Pb$(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In various embodiments, the HKMG stack 60 can have a thickness in the range of about 1.5 nm to about 2.5 nm.

Figure 24:
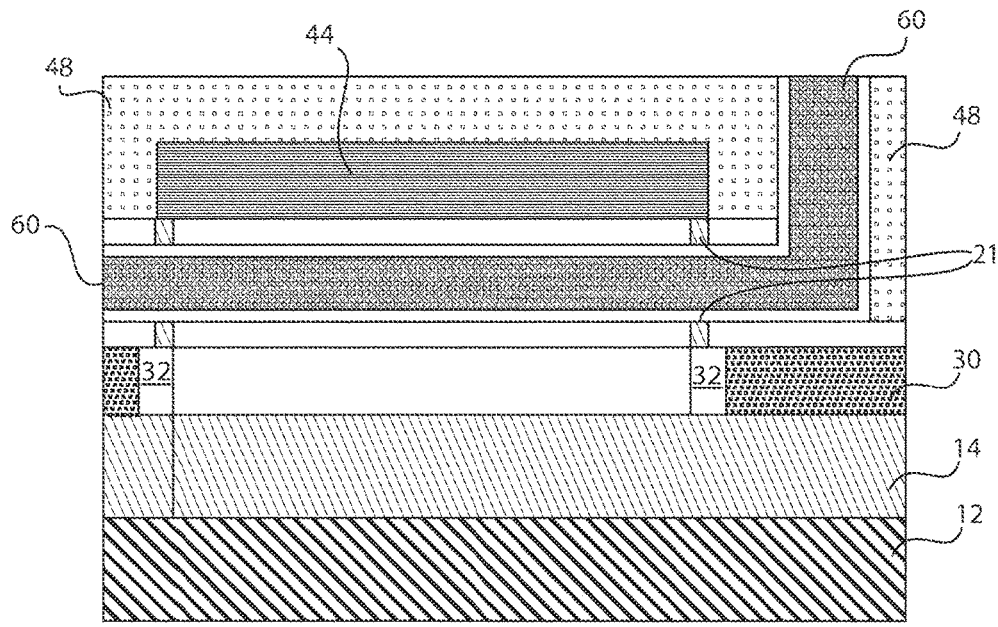
FIG. 24 is a side view of the semiconductor device of FIG. 23 illustrating the HKMG stack within the gate cavity and adjacent the dumbbell fin structure, in accordance with an embodiment of the present invention.

FIG. 24 is a side view of the semiconductor device of FIG. 23 illustrating the HKMG stack within the gate cavity and adjacent the dumbbell fin structure, in accordance with an embodiment of the present invention.

The side view illustrates the HKMG stack 60 in relation to the first and second spacers 34, 40. The HKMG stack 60 is shown to have a substantially rectangular shape. One side or surface of the HKMG stack 60 can engage or contact one spacer and another side or surface of the HKMG stack 60 can engage or contact another spacer.

Figure 25A:
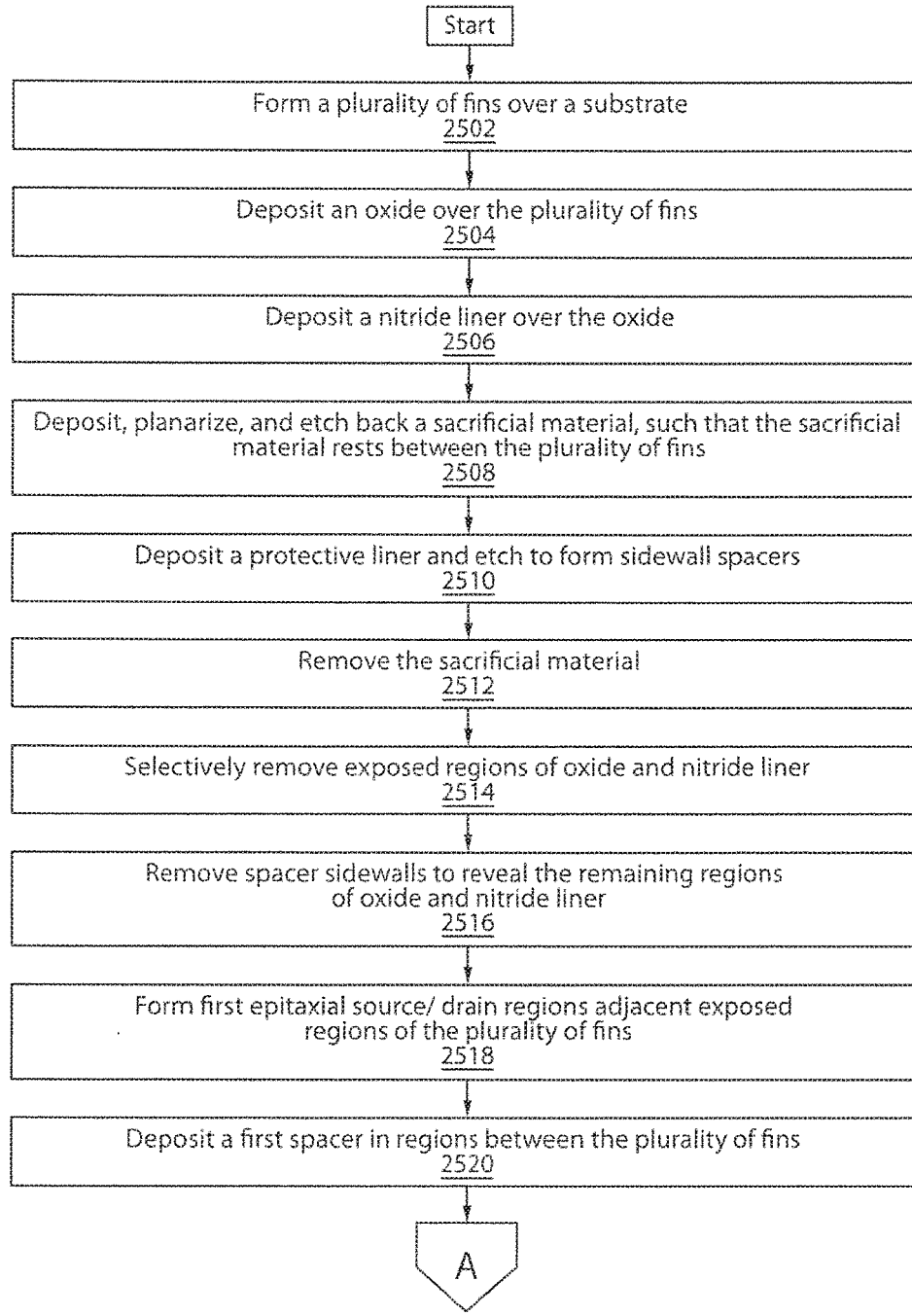
FIGS. 25A and 25B illustrate a block/flow diagram of an exemplary method for forming a VFET structure, in accordance with an embodiment of the present invention.
Figure 25B:
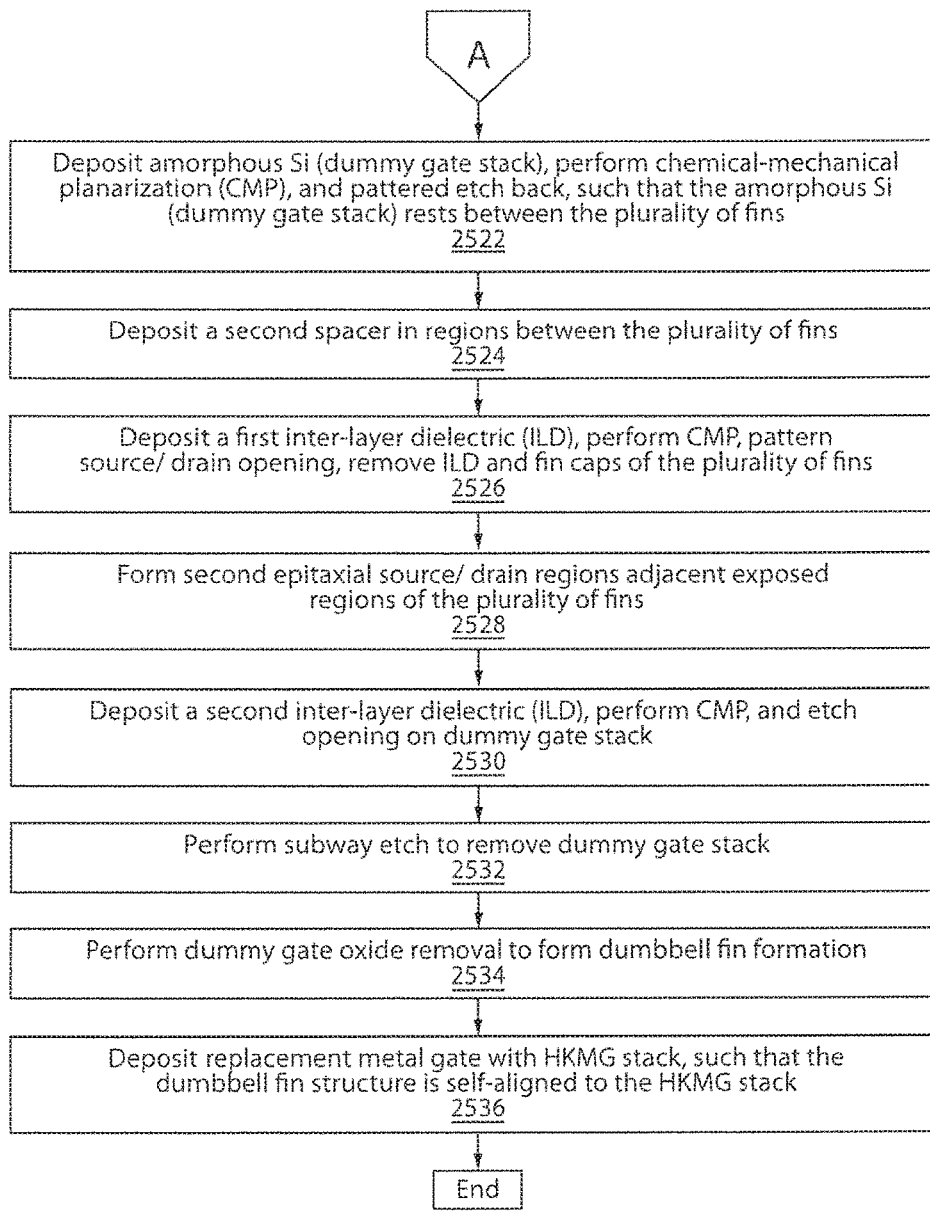

FIG. 25 is a block/flow diagram of an exemplary method for forming a VFET structure, in accordance with an embodiment of the present invention.

At block 2502, a plurality of fins are formed over a substrate.

At block 2504, an oxide is deposited over the plurality of fins.

At block 2506, a nitride liner is deposited over the oxide.

At block 2508, a sacrificial material is deposited, planarized, and etched back, such that the sacrificial material rests between the plurality of fins.

At block 2510, a protective liner is deposited and etched to form sidewall spacers.

At block 2512, the sacrificial material is removed.

At block 2514, exposed regions of oxide and nitride liner are selectively removed.

At block 2516, spacer sidewalls are removed to reveal the remaining regions of oxide and nitride liner.

At block 2518, first epitaxial source/drain regions are formed adjacent exposed regions of the plurality of fins.

At block 2520, a first spacer is deposited in regions between the plurality of fins.

At block 2522, amorphous Si (dummy gate stack) is deposited, chemical-mechanical planarization (CMP) is performed, and pattered etch back is performed, such that the amorphous Si (dummy gate stack) rests between the plurality of fins.

At block 2524, a second spacer is deposited in regions between the plurality of fins.

At block 2526, a first inter-layer dielectric (ILD) is deposited, CMP is performed, a pattern source/drain opening is created, the ILD is removed, and the fin caps of the plurality of fins are further removed.

At block 2528, second epitaxial source/drain regions are formed on a top portion of the plurality of fins.

At block 2530, a second inter-layer dielectric (ILD) is deposited, CMP is performed, and an etch opening is created on dummy gate stack.

At block 2532, a subway etch is performed to remove the dummy gate stack.

At block 2534, dummy gate oxide removal is performed to form dumbbell fin formation.

At block 2536, a replacement metal gate with HKMG stack is deposited, such that the dumbbell fin structure is self-aligned to the HKMG stack.

Figure 26:
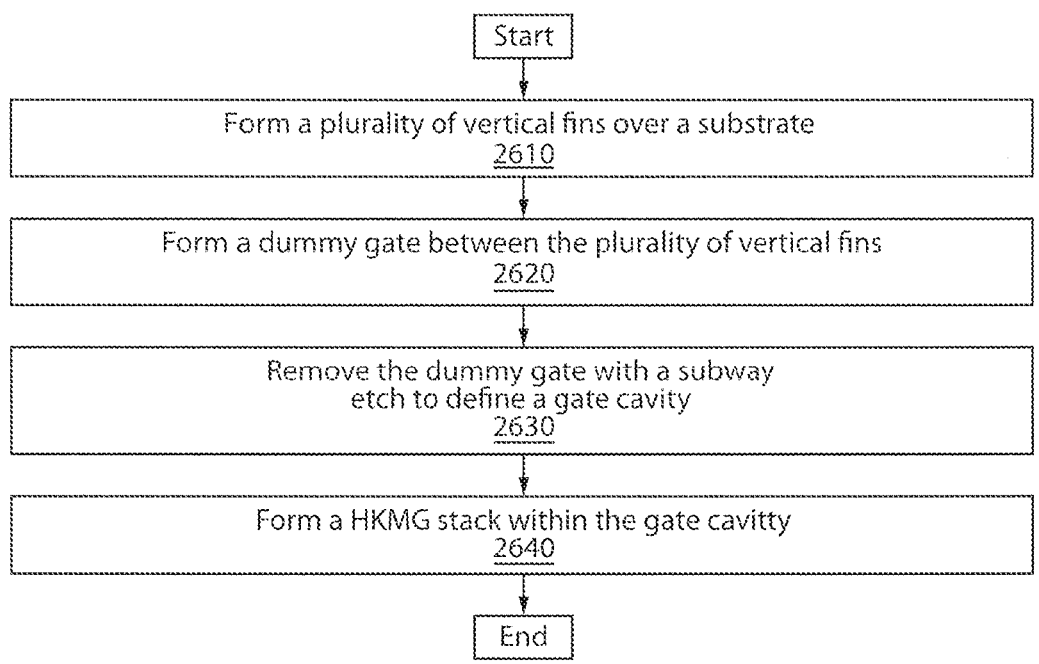
FIG. 26 is a block/flow diagram of an exemplary method for forming a VFET structure with a HKMG stack between the dumbbell fin structures, in accordance with an embodiment of the present invention.

FIG. 26 is a block/flow diagram of an exemplary method for forming a VFET structure with a HKMG stack between the dumbbell fin structures, in accordance with an embodiment of the present invention.

At block 2610, a plurality of vertical fins are formed over a substrate.

At block 2620, a dummy gate is formed between the plurality of vertical fins.

At block 2630, the dummy gate is removed with a subway etch to define a gate cavity.

At block 2640, a high-k metal gate (HKMG) stack is formed within the gate cavity.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical field effect transistor (VFET) structure, the method comprising:
   forming a plurality of fins each covered with one or more dielectric liners over a substrate;
   recessing a portion of the one or more dielectric liners to expose a section of each of the plurality of fins;
   forming a first vertically arranged source and drain adjacent the exposed section of each of the plurality of fins, such that a vertical channel is defined between each of the first vertically arranged source and drain;
   forming a dummy gate between the plurality of fins;
   forming a second vertically arranged source and drain over the dummy gate;

removing the dummy gate with a subway etch to define a gate cavity; and forming a high-k metal gate (HKMG) stack within the gate cavity.

2. The method of claim 1, wherein each fin of the plurality of fins includes a first section having a first width, a second section having a second width, and a third section having a third width, the first and third sections connected to each other by the second section to form a dumbbell fin structure.

3. The method of claim 2, wherein the first width is substantially equal to the third width, and the first and third widths are greater than the second width.

4. The method of claim 3, wherein the second width is self-aligned to the HKMG stack.

5. The method of claim 2, wherein the HKMG stack engages an outer surface of the second section of a fin when disposed between a first spacer and a second spacer.

6. The method of claim 2, wherein the first section of each fin of the plurality of fins engages the first vertically arranged source and drain and the third section of each fin of the plurality of fins engages the second vertically arranged source and drain.

7. The method of claim 1, wherein the first vertically arranged source and drain and the second vertically arranged source and drain are formed before the HKMG stack.

8. The method of claim 1, wherein the HKMG stack is defined by a replacement metal gate (RMG) process, the RMG process defined in part by the subway etch.

9. The method of claim 8, wherein the subway etch enables removal of the dummy gate from a side portion of the VFET structure.

10. The method of claim 1, wherein at least one material of the HKMG stack has a dielectric constant greater than 7.

* * * * *